(12) United States Patent
Toshima et al.

(10) Patent No.: US 10,068,798 B2
(45) Date of Patent: Sep. 4, 2018

(54) METHOD AND PROCESSING APPARATUS FOR PERFORMING PRE-TREATMENT TO FORM COPPER WIRING IN RECESS FORMED IN SUBSTRATE

(71) Applicant: TOKYO ELECTRON LIMITED, Tokyo (JP)

(72) Inventors: Hiroyuki Toshima, Nirasaki (JP); Tatsuo Hatano, Nirasaki (JP); Shinji Furukawa, Nirasaki (JP); Naoki Watanabe, Nirasaki (JP); Naoyuki Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/627,478

(22) Filed: Jun. 20, 2017

(65) Prior Publication Data

US 2017/0372951 A1  Dec. 28, 2017

(30) Foreign Application Priority Data

Jun. 27, 2016  (JP) .................................. 2016-126715

(51) Int. Cl.
| | | |
|---|---|---|
| H01L 21/48 | (2006.01) |
| H01L 21/768 | (2006.01) |
| H01L 21/687 | (2006.01) |
| H01J 37/32 | (2006.01) |
| H01J 37/34 | (2006.01) |

(52) U.S. Cl.
CPC .. *H01L 21/76862* (2013.01); *H01J 37/32715* (2013.01); *H01J 37/32733* (2013.01); *H01J 37/32899* (2013.01); *H01J 37/3435* (2013.01); *H01L 21/68764* (2013.01); *H01L 21/76802* (2013.01); *H01L 21/76843* (2013.01); *H01L 21/76871* (2013.01); *H01L 21/76879* (2013.01)

(58) Field of Classification Search
CPC ......... H01L 21/76883; H01L 21/76886; H01L 21/76802; H01L 21/7684; H01L 21/7685; H01L 21/76843; H01L 21/76849
See application file for complete search history.

(56) References Cited

U.S. PATENT DOCUMENTS

2003/0145790 A1 * 8/2003 Sakamoto ............... C23C 16/14
                                                          118/723 E

FOREIGN PATENT DOCUMENTS

JP          2001-060589 A       3/2001

* cited by examiner

*Primary Examiner* — (Vikki) Hoa B Trinh
(74) *Attorney, Agent, or Firm* — Nath, Goldberg & Meyer; Jerald L. Meyer

(57) ABSTRACT

There is provided a method for performing a pre-treatment to form a copper wiring in a recess formed in a substrate, which includes forming a barrier layer on a surface of the substrate that defines the recess, and forming a seed layer on the barrier layer. The method further includes at least one of etching the barrier layer and etching the seed layer. In the at least one of etching the barrier layer and etching the seed layer, the substrate is inclined with respect to an irradiation direction of ions while rotating the substrate.

4 Claims, 10 Drawing Sheets

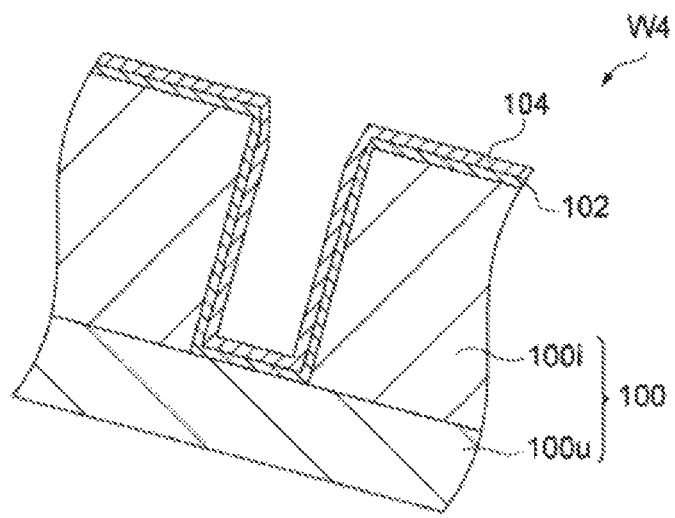
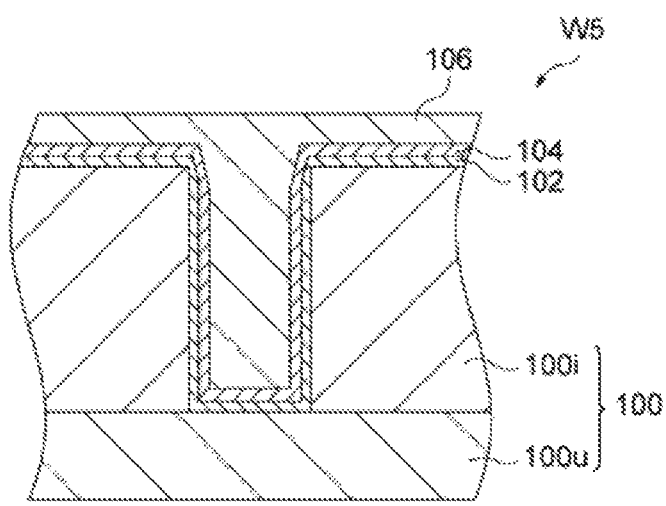

METHOD AND PROCESSING APPARATUS FOR PERFORMING PRE-TREATMENT TO FORM COPPER WIRING IN RECESS FORMED IN SUBSTRATE

CROSS-REFERENCE TO RELATED APPLICATION

This application claims the benefit of Japanese Patent Application No. 2016-126715, filed on Jun. 27, 2016, in the Japan Patent Office, the disclosure of which is incorporated herein in its entirety by reference.

TECHNICAL FIELD

The present disclosure relates to a method and a processing apparatus for performing a pre-treatment to form a copper wiring in a recess formed in a substrate.

BACKGROUND

A damascene method has been used as a wiring work technology of a semiconductor device. In such a damascene method, a recess is formed in a substrate. Subsequently, a barrier layer is formed on a wall surface that defines the recess. A seed layer is then formed on the barrier layer. Thereafter, copper is embedded in the recess. In general, a sputtering method is used to form the barrier layer and the seed layer, and a plating method is used to embed the copper.

In the wiring work, the barrier layer and the seed layer become locally thicker in a corner portion of the substrate, which defines an opening of the recess. That is to say, a base metal layer formed in the corner portion becomes thick. As a result, the width of an opening of the recess is narrowed. When copper is embedded in the recess with the opening narrowed, defective embedding of copper occurs in the recess. For example, voids are generated.

To suppress the generation of voids requires expanding the width of the opening of the recess narrowed by the base metal layer. In order to expand the width of the opening, performing a sputter etching on the base metal layer may be considered. In such a sputter etching, however, the wall surface that defines the recess, for example, the base metal layer formed on a bottom surface, as well as the base metal layer formed in the corner portion, may be also etched. As a result, the base metal layer becomes thinner, and, in some cases, the base metal layer may be removed.

SUMMARY

Some embodiments of the present disclosure provide a technique for suppressing loss of a base metal layer formed on a wall surface that defines a recess and expanding the width of an opening of the recess reduced by the base metal layer.

According to one embodiment of the present disclosure, there is provided a method for performing a pre-treatment to form a copper wiring in a recess formed in a substrate, which includes: forming a barrier layer on a surface of the substrate that defines the recess; and forming a seed layer on the barrier layer. The method further includes: at least one of etching the barrier layer and etching the seed layer, wherein, in the at least one of etching the barrier layer and etching the seed layer, the substrate is inclined with respect to an irradiation direction of ions while rotating the substrate.

According to another embodiment of the present disclosure, there is provided a processing apparatus, including: a mounting table including a holding part configured to hold a substrate and to rotate about a first axis line as a central axis line of the holding part, the mounting table being configured to rotate about a second axis line perpendicular to the first axis line; and a chamber body configured to provide a chamber which accommodates the mounting table therein, the chamber including a first space for film formation and a second space for etching which are arranged in a circumferential direction with respect to the second axis line.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6A is a view illustrating a workpiece after etching the seed layer, and FIG. 6B is a view illustrating a workpiece after embedding copper.

DETAILED DESCRIPTION

Figure 1:
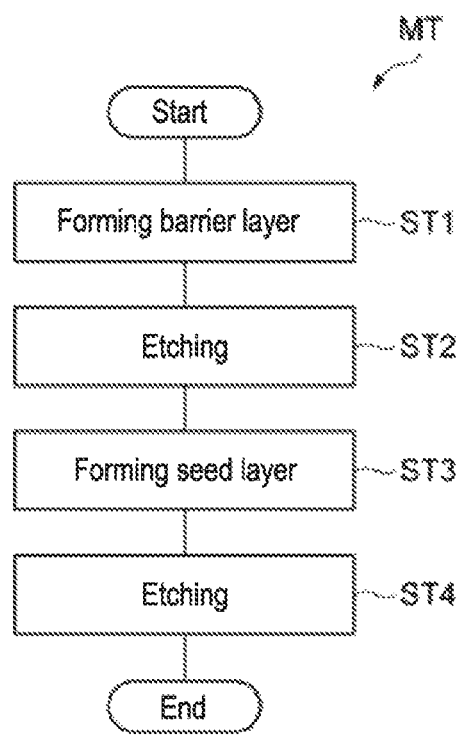
FIG. 1 is a flowchart illustrating one embodiment of a method of performing a pre-treatment to form a copper wiring in a recess formed in a substrate.

Reference will now be made in detail to various embodiments, examples of which are illustrated in the accompanying drawings. Further, in the drawings, the same or equivalent parts are denoted by the same reference numerals. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 2A:
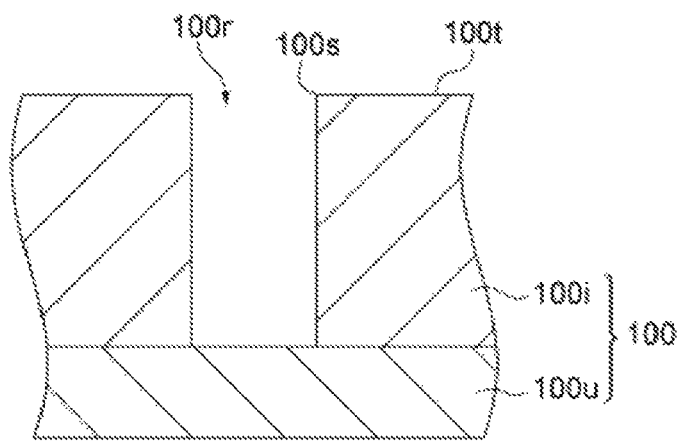
FIG. 2A is a view illustrating a substrate to which the method illustrated in FIG. 1 is applied.

FIG. 1 is a flowchart illustrating one embodiment of a method of performing a pre-treatment to form a copper wiring in a recess formed in a substrate. A method MT illustrated in FIG. 1 relates to a pre-treatment performed before a process of forming a copper wiring in a recess of the substrate. Before performing the method MT, a substrate 100 is prepared. FIG. 2A is a view illustrating a substrate to which the method illustrated in FIG. 1 is applied. The substrate 100 illustrated in FIG. 2A has, for example, a substantially disc shape. The substrate 100 includes a base layer 100u and an insulation film 100i. The insulation film 100i is formed on the base layer 100u. The insulation film 100i is formed of, for example, silicon oxide or a low dielectric constant material (low-k material), but is not limited thereto. The substrate 100 has an upper surface 100t. The upper surface 100t is provided by the insulation film 100i. A recess 100r is formed in the insulation film 100i. The recess 100r is formed to extend from the upper surface 100t in a thickness direction of the substrate 100. The recess 100r may be, for example, a groove or hole. The recess 100r is formed by, for example, photolithography or etching.

As illustrated in FIG. 1, in the method MT, first, at step ST1, a barrier layer 102 is formed on a surface of the substrate 100 in which the recess 100r is defined. The barrier layer 102 is formed of, for example, metal such as Ta or TaN. The barrier layer 102 is formed by, for example, a sputtering method.

Figure 2B:
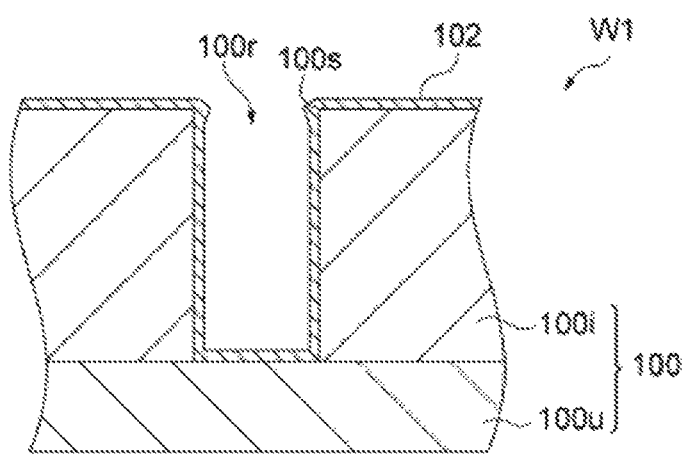
FIG. 2B is a view illustrating a workpiece including a substrate on which a barrier layer is formed.

FIG. 2B is a view illustrating a workpiece including a substrate on which a barrier layer is formed. In the method MT, a workpiece W1 illustrated in FIG. 2B is obtained by executing step ST1. The workpiece W1 includes the substrate 100 and the barrier layer 102 formed on the surface of the substrate 100. As illustrated in FIG. 2B, a thickness of the barrier layer 102 becomes locally thicker in a corner portion 100s (or a shoulder portion) of the substrate 100. Thus, the width of an opening of the recess 100r is narrowed. Further, the corner portion 100s is a portion where a lateral surface and the upper surface 100t of the insulation film 100i that defines the recess 100r intersect.

Figure 3A:
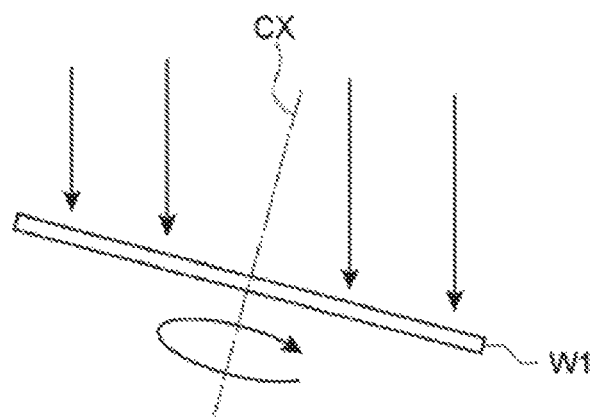
FIGS. 3A and 3B are views illustrating etching of the barrier layer.
Figure 3B:
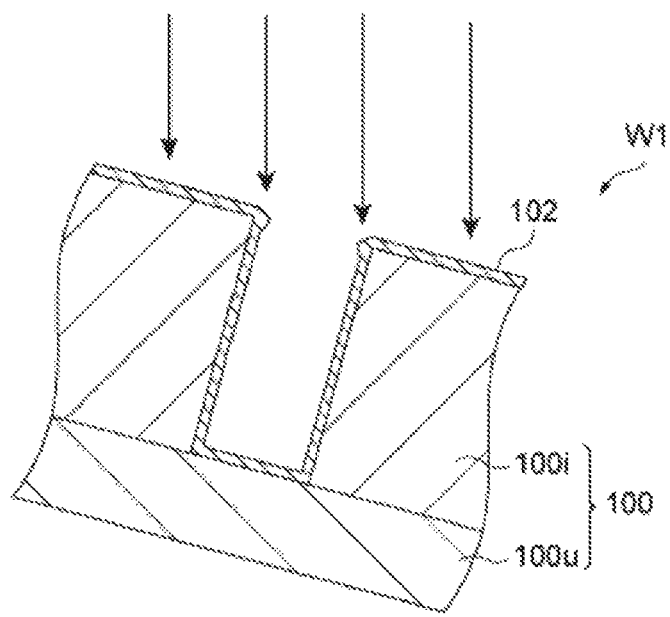

In the method MT, step ST2 is subsequently performed. At step ST2, the barrier layer 102 of the workpiece W1 is etched. FIG. 3A and FIG. 3B are views illustrating etching of the barrier layer 102. In FIG. 3A, the entire workpiece W1 is illustrated, and in FIG. 3B, a portion of the workpiece W1 is scaled up.

As illustrated in FIG. 3A and FIG. 3B, at step ST2, ions are irradiated to the workpiece W1 so as to etch the barrier layer 102. Such ions are generated by plasma generated by exciting, for example, a noble gas such as an argon gas or an inert gas such as a nitrogen gas. At step ST2, the workpiece W1 is arranged to be inclined with respect to an irradiation direction (a direction indicated by downward-oriented arrows in FIG. 3A and FIG. 3B) of ions. For example, the workpiece W1 is inclined such that a central axis line CX of the workpiece W1 is at an angle which falls within a range of 10 to 60 degrees with respect to the irradiation direction of ions. In addition, the central axis line CX is parallel to the thickness direction of the substrate 100 and includes the center of the workpiece W1. Further, at step ST2, the workpiece W1 is rotated about the central axis line CX.

Figure 4A:
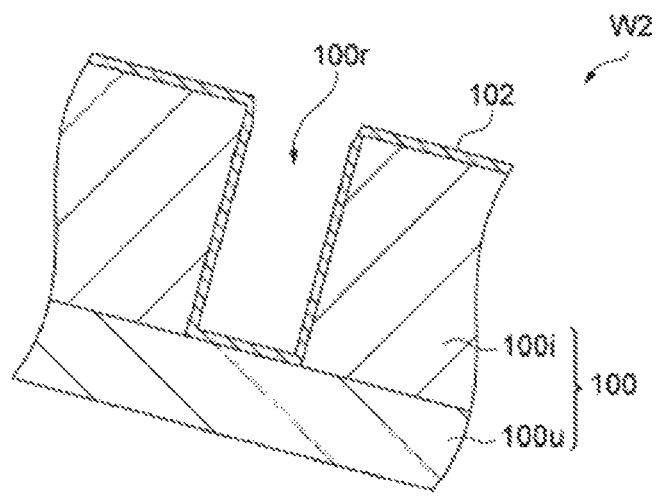
FIG. 4A is a view illustrating a workpiece after etching the barrier layer.

As etching is performed in a state in which the workpiece W1 is inclined with respect to the irradiation direction of ions, ions are irradiated to the barrier layer 102 formed on the corner portion 100s. Meanwhile, the ions are suppressed from entering the recess 100r. Therefore, the barrier layer 102 formed on the corner portion 100s is preferentially etched. This suppresses loss of the barrier layer 102 formed on the wall surface that defines the recess 100r and expands the width of the opening of the recess 100r narrowed by the formation of the barrier layer 102. Further, at step ST2, since the workpiece W1 rotates about the central axis line CX, the barrier layer 102 formed on the corner portion 100s is uniformly etched. FIG. 4A is a view illustrating a workpiece after etching the barrier layer. As illustrated in FIG. 4A, the thickness of the barrier layer 102 formed on the corner portion 100s is locally reduced by executing step ST2. Thus, a workpiece W2 in which the width of the opening of the recess 100r narrowed by the formation of the barrier layer 102 is expanded, is obtained.

In the method MT, step ST3 is subsequently performed. At step ST3, a seed layer 104 is formed on the barrier layer 102. The seed layer 104 is formed of copper. The seed layer 104 is formed by, for example, a sputtering method.

Figure 4B:
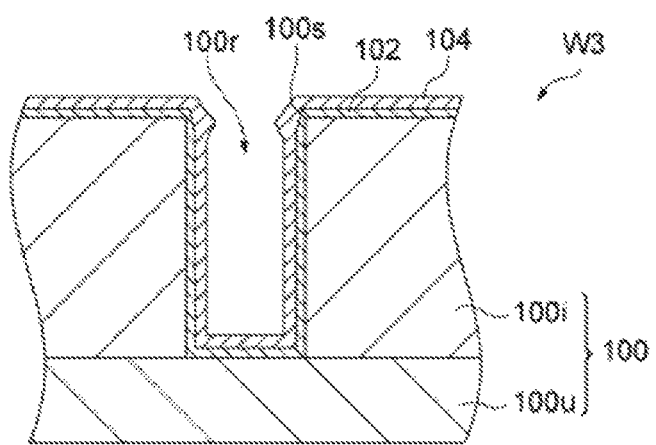
FIG. 4B is a view illustrating a workpiece after forming a seed layer.

FIG. 4B is a view illustrating a workpiece after formation of the seed layer. A workpiece W3 illustrated in FIG. 4B is obtained by executing step ST3. The workpiece W3 includes the substrate 100, the barrier layer 102, and the seed layer 104 formed on the barrier layer 102. As illustrated in FIG. 4B, a thickness of the seed layer 104 is locally thickened at the corner portion 100s (or a shoulder portion) of the substrate 100. Thus, the width of the opening of the recess 100r is narrowed.

Figure 5A:
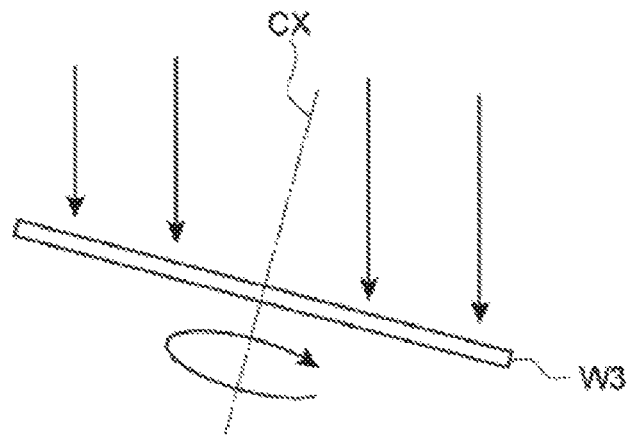
FIGS. 5A and 5B are views illustrating etching of the seed layer.
Figure 5B:
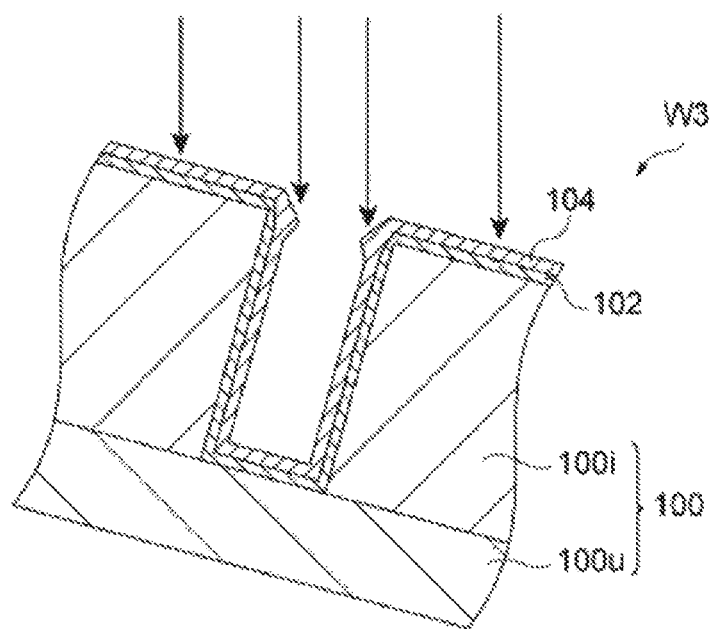

In the method MT, step ST4 is subsequently executed. At step ST4, the seed layer 104 of the workpiece W3 is etched. FIG. 5A and FIG. 5B illustrate etching of the seed layer. In FIG. 5A, the entire workpiece W3 is illustrated, and in FIG. 5B, a portion of the workpiece W3 is scaled up.

As illustrated in FIG. 5A and FIG. 5B, at step ST4, ions are irradiated to the workpiece W3 so as to etch the seed layer 104. The ions are generated by plasma generated by exciting, for example, a noble gas such as an argon gas or an inert gas such as a nitrogen gas. At step ST4, the workpiece W3 is arranged to be inclined with respect to the irradiation direction (a direction indicated by downward-oriented arrows in FIG. 5A and FIG. 5B) of ions. For example, the workpiece W3 is inclined such that a central axis line CX of the workpiece W3 is at an angle which falls within a range of 10 to 60 degrees with respect to the irradiation direction of ions. Further, the central axis line CX of the workpiece W3 is the same as that of the workpiece W1. Also, at step ST4, the workpiece W3 is rotated about the central axis line CX.

As etching is performed in a state in which the workpiece W3 is inclined with respect to the irradiation direction of ions, ions are irradiated to the seed layer 104 formed on the corner portion 100s. Meanwhile, the ions are suppressed from entering the recess 100r. Therefore, the seed layer 104 formed on the corner portion 100s is preferentially etched. This suppresses loss of the seed layer 104 formed on the wall surface that defines the recess 100r and expands the width of the opening of the recess 100r narrowed by the formation of the seed layer 104. Further, at step ST4, since the workpiece W3 rotates about the central axis line CX, the seed layer 104 formed on the corner portion 100s is uniformly etched. FIG. 6A is a view illustrating a workpiece after etching the seed layer. As illustrated in FIG. 6A, the thickness of the seed layer 104 formed on the corner portion 100s is locally reduced by executing step ST4. Thus, a workpiece W4 in which the width of the opening of the corner portion 100s narrowed by the formation of the seed layer 104 is expanded, is produced.

FIG. 6B is a view illustrating a workpiece after embedding copper. In forming a copper wiring, after the method MT is performed, a copper 106 is embedded in the recess 100r. Accordingly, a workpiece W5 is obtained. For example, a plating method is used to embed copper. Further, the copper 106 formed on the upper surface 100t is removed by a chemical mechanical polishing (CMP) method so that the copper wiring is formed inside the recess 100r.

Figure 7:
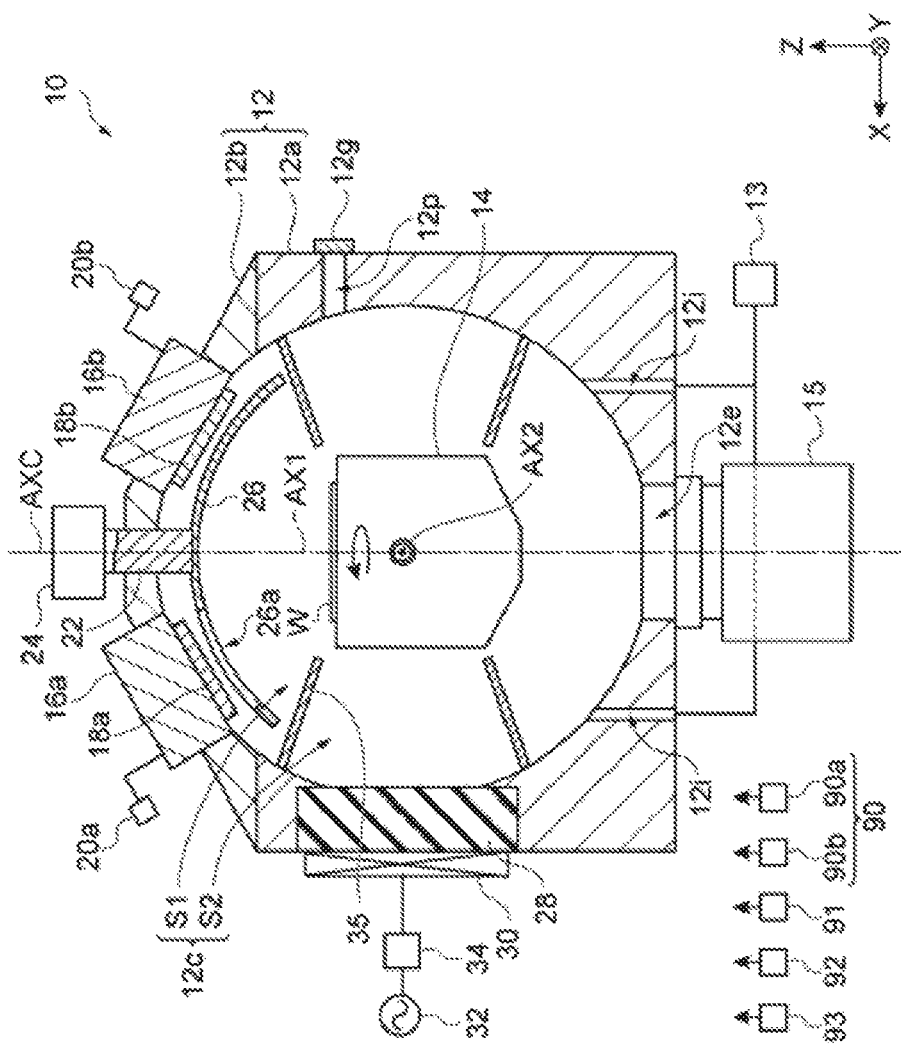
FIG. 7 is a view illustrating a processing apparatus according to one embodiment of the present disclosure.

Hereinafter, a processing apparatus that can be used to implement the method MT will be described. FIG. 7 is a view illustrating a processing apparatus according to one embodiment of the present disclosure. A processing apparatus 10 illustrated in FIG. 7 includes a chamber body 12 and a mounting table 14.

The chamber body 12 includes an internal space defined as a chamber 12c. The chamber 12c is, for example, a substantially spherical space, but is not limited thereto. The chamber body 12 is formed of; for example, metal such as aluminum, and is grounded. Further, a coating such as an alumite film is applied to an inner wall surface of the chamber body 12. In one embodiment, the chamber body 12 includes a main portion 12a and a cover portion 12b. The cover portion 12b is installed on the main portion 12a and is configured to be attachable to and detachable from the main portion 12a.

An opening 12p through which the aforementioned substrate or workpiece is loaded into or unloaded from the chamber 12c is formed in the sidewall portion of the chamber body 12. The opening 12p is configured to be opened and closed by a gate valve 12g.

Further, a gas supply part 13 is connected to the chamber body 12. The gas supply part 13 is configured to supply a gas to the chamber 12c. The gas supply part 13 may include a gas source, a flow rate controller such as a mass flow controller, and an opening/closing valve. The gas source may be, for example, a source of a noble gas such as an argon gas and/or an inert gas such as a nitrogen gas. The gas source is coupled to the chamber 12c via the flow rate controller and the opening/closing valve. In one embodiment, the gas supply part 13 is connected to gas introduction paths 12i installed in a bottom portion of the chamber body 12.

In addition, an exhaust device 15 is connected to the chamber body 12. The exhaust device 15 may include a pressure regulating valve and a vacuum pump such as a turbo molecular pump. In one embodiment, the exhaust device 15 is connected to an exhaust hole 12e formed in the center of the bottom portion of the chamber body 12.

The mounting table 14 is installed inside the chamber 12c. The chamber 12c includes a first space S1 and a second space S2. The first space S1 and the second space S2 are arranged in a circumferential direction with respect to a second axis line AX2 of the mounting table 14 which will be described later. In one embodiment, the first space S1 is provided above the mounting table 14 (in a Z direction), and the second space S2 is provided in a horizontal direction (X direction) with respect to the mounting table 14.

The first space S1 is a space for film formation. In one embodiment, a target holder 16a and a target holder 16b are installed above the first space S1. The target holder 16a and the target holder 16b are installed in the cover portion 12b. The target holder 16a and the target holder 16b are formed of conductors and electrically separated (insulated) from the cover portion 12b. The target holder 16a holds a target 18a at the first space S1 side. The target holder 16b holds a target 18b at the first space S1 side. The target 18a is formed of, for example, copper. The target 18b is formed of a material which is the same as that forming the aforementioned barrier layer 102. That is to say, the target 18b is formed of, for example, metal such as Ta or TaN. A power supply 20a is connected to the target holder 16a. Further, a power supply 20b is connected to the target holder 16b. The power supply 20a and the power supply 20b may be DC power supplies or high-frequency power supplies.

In one embodiment, the target holder 16a and the target holder 16b are disposed symmetrically with respect to a central axis line AXC. The central axis line AXC is an axis line extending in a vertical direction (Z direction), and corresponds a central axis line of the chamber 12c. In the processing apparatus 10, the target 18a held by the target holder 16a and the target 18b held by the target holder 16b are also disposed symmetrically with respect to the central axis line AXC. Further, the target holder 16a holds the target 18a such that the target 18a is inclined with respect to the central axis line AXC and the target holder 16b holds the target 18b such that the target 18b is inclined with respect to the central axis line AXC.

In addition, in the processing apparatus 10, a shaft body 22 is installed to penetrate the cover portion 12b along the central axis line AXC. A rotation driving device 24 (e.g., a motor) is connected to the shaft body 22 installed outside the chamber body 12. A shutter 26 is coupled to the shaft body 22 inside the chamber body 12, i.e., in the first space S1. The shutter 26 is arranged between the targets 18a and 18b and the mounting table 14. An opening 26a for allowing the target 18a or the target 18b to be exposed to the mounting table 14 is formed in the shutter 26. A position of the opening 26a of the shutter 26 in a rotational direction with respect to the central axis line AXC is adjusted by the rotation driving device 24. It is therefore possible to selectively expose one of the target 18a and the target 18b with respect to the mounting table 14. Further, it is possible to block both the target 18a and the target 18b from the mounting table 14 with the shutter 26.

In the processing apparatus 10, an opening is formed at the side of the second space S2 in the chamber body 12. This opening is closed by a window member 28. The window member 28 is formed of a dielectric material such as quartz. Further, an antenna (coil) 30 is installed to face the window member 28 outside the chamber body 12. A high-frequency power supply 32 is coupled to the antenna 30 via a matcher 34. The high-frequency power supply 32 supplies a high frequency to the antenna 30 in order to excite a gas supplied from the gas supply part 13 into the chamber 12c. The matcher 34 is equipped with a matching circuit for matching output impedance of the high-frequency power supply 32 and a load, i.e., impedance of the chamber body 12 side. In the processing apparatus 10, the high-frequency power supply 32 and the antenna 30 constitute an inductively coupled plasma generating part.

In one embodiment, the processing apparatus 10 further includes a partition wall 35. The partition wall 35 extends from the chamber body 12 into the chamber 12c, and is installed between the first space S1 and the second space S2. The partition wall 35 suppresses a substance released from the target 18a or the target 18b from entering the second space S2. Further, the partition wall 35 suppresses active species generated in the second space S2 from entering the first space S1. In addition, the partition wall 35 may be appropriately installed inside the chamber 12c such that, for example, each of the first space S1 and the second space S2 are partitioned with an appropriate volume.

Figure 8:
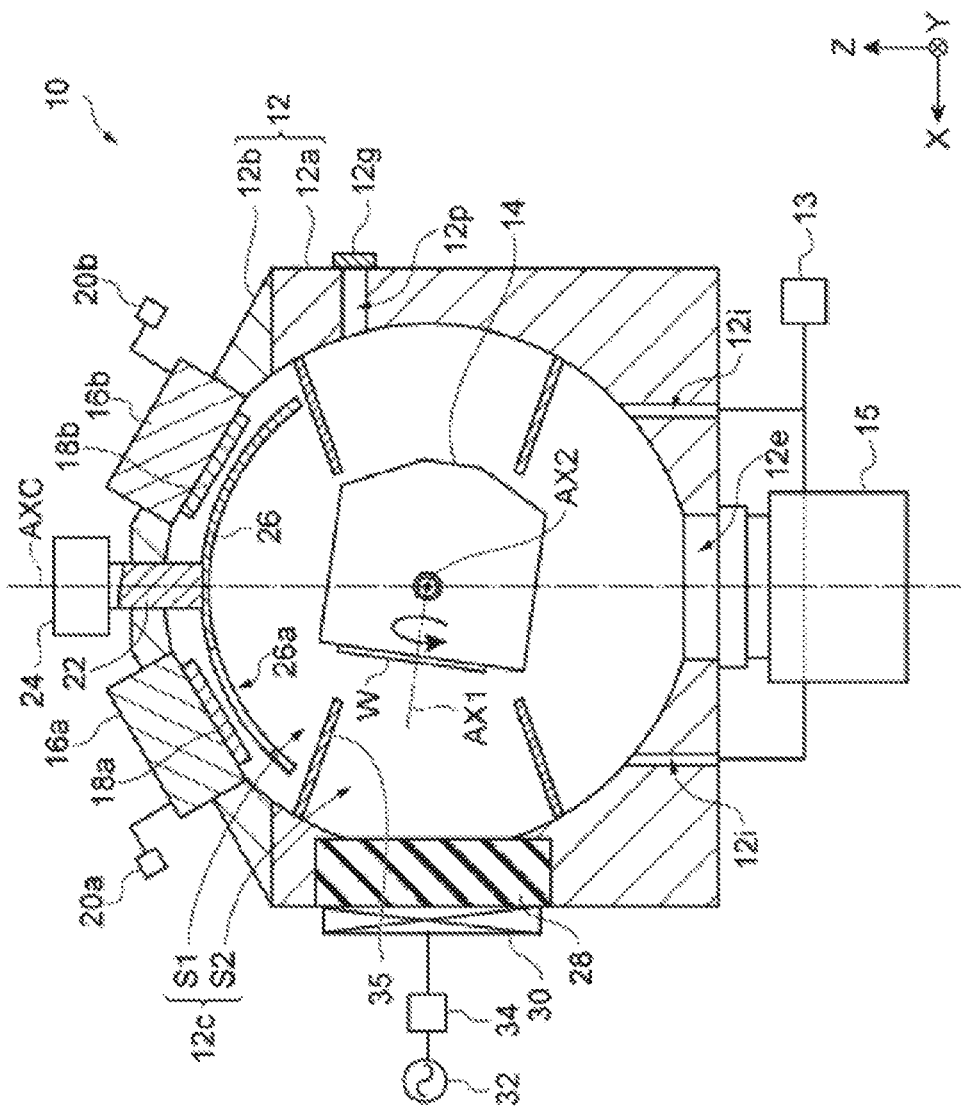
FIG. 8 is a view illustrating a processing apparatus according to one embodiment of the present disclosure.
Figure 9:
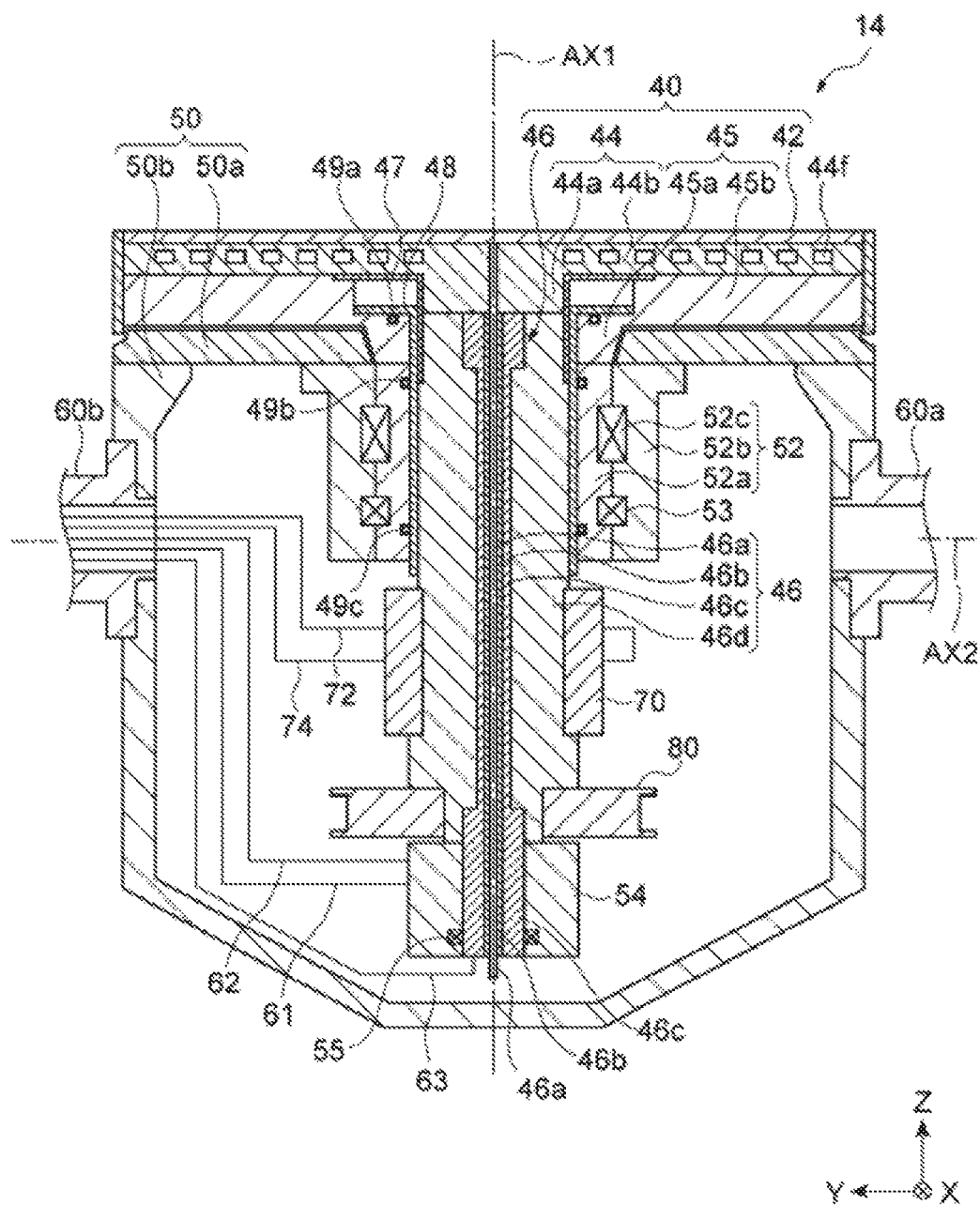
FIG. 9 is a cross sectional view of a mounting table according to one embodiment of the present disclosure.
Figure 10:
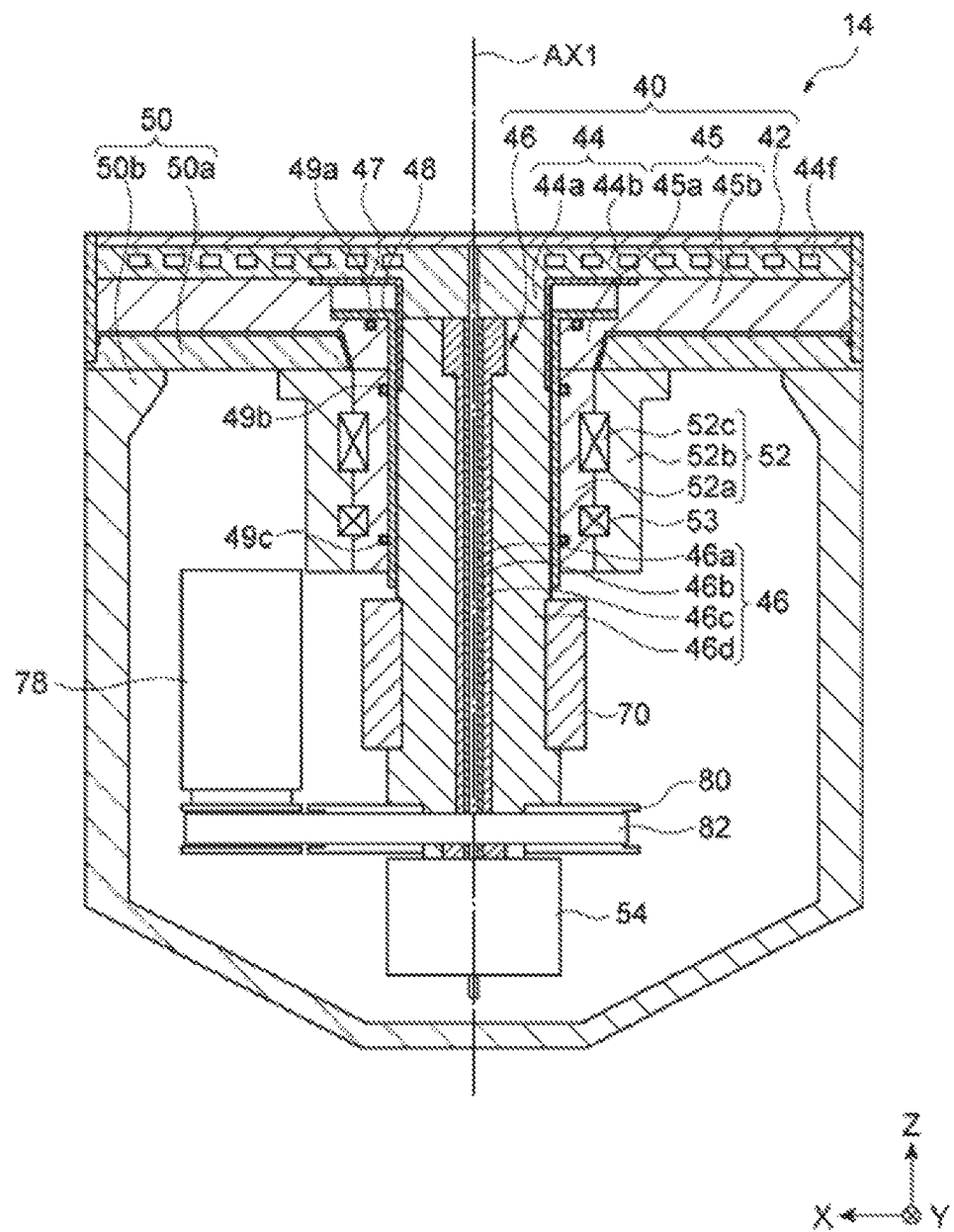
FIG. 10 is a cross sectional view of a mounting table according to one embodiment of the present disclosure.

Next, the mounting table 14 will be described in detail. FIG. 8 is a view illustrating a processing apparatus according to one embodiment of the present disclosure. In FIG. 8, the mounting table 14 is illustrated as being obliquely disposed by rotating about the second axis line AX2 from the state illustrated in FIG. 7. FIGS. 9 and 10 are cross sectional views of the mounting table according to one embodiment of the present disclosure. Hereinafter, FIGS. 7 to 10 will be referred to.

The mounting table 14 is a mechanism configured to hold the workpiece W. The mounting table 14 holds the workpiece W such that the central axis line of the workpiece W is aligned with a first axis line AX1. Further, the mounting table 14 is configured to rotate the workpiece W about the first axis line AX1. In addition, the mounting table 14 is configured to rotate about the aforementioned second axis line AX2 perpendicular to the first axis line AX1. The second axis line AX2 extends in a direction (Y direction) perpendicular to the vertical direction (Z direction). As illustrated in FIG. 7, in a case where an angular position of the mounting table 14 in a circumferential direction with respect to the second axis line AX2 is set such that the first axis line AX1 is aligned with the central axis line AXC, the workpiece W faces the first space S1 side. In the state illustrated in FIG. 7, film formation is performed on the workpiece W. Further, when the mounting table 14 is rotated about the second axis line AX2 from the state illustrated in FIG. 7 to the state illustrated in FIG. 8, the workpiece W faces the second space S2 side. In the state illustrated in FIG. 8, ions are irradiated to the workpiece W, i.e., the workpiece W is etched.

As illustrated in FIGS. 9 and 10, the mounting table 14 includes a holding part 40, a vessel 50, and a pair of shaft parts 60a and 60b. The holding part 40 is configured to hold the workpiece W. Further, the holding part 40 is configured to rotate about the first axis line AX1 as its central axis line so as to rotate the workpiece W. The holding part 40 includes an electrostatic chuck 42, a lower electrode 44, a shaft part 46, and an insulating member 45.

The electrostatic chuck 42 is configured to hold the workpiece W on its upper surface. The electrostatic chuck 42 has a substantially disc shape. A central axis line of the electrostatic chuck 42 is aligned with the first axis line AX1. The electrostatic chuck 42 includes an electrode film formed as an inner layer of the insulation film. The electrostatic chuck 42 generates an electrostatic force based on a voltage applied to the electrode film. By virtue of the electrostatic force, the electrostatic chuck 42 adsorbs and holds the workpiece W placed thereon. In some embodiments, a heat transfer gas such as an He gas or an Ar gas may be supplied between the electrostatic chuck 42 and the workpiece W. Further, a heater for heating the workpiece W may be embedded in the electrostatic chuck 42. The electrostatic chuck 42 is installed on the lower electrode 44.

The lower electrode 44 has a substantially disc shape. A central axis line of the lower electrode 44 is aligned with the first axis line AX1. In one embodiment, the lower electrode 44 includes a first portion 44a and a second portion 44b. The first portion 44a is a central portion of the lower electrode 44 extending along the first axis line AX1. The second portion 44b is a portion that is further spaced apart from the first axis line AX1 than the first portion 44a, i.e., a portion extending outward of the first portion 44a.

An upper surface of the first portion 44a and an upper surface of the second portion 44b are coplanar. A substantially flat upper surface of the lower electrode 44 is formed by the upper surface of the first portion 44a and the upper surface of the second portion 44b. The electrostatic chuck 42 is installed on the upper surface of the lower electrode 44. Further, the first portion 44a protrudes downward relative to the second portion 44b and has a cylindrical shape. That is to say, a lower surface of the first portion 44a extends downward relative to a lower surface of the second portion 44b.

The lower electrode 44 is made of a conductor such as aluminum or stainless steel. The lower electrode 44 is electrically connected to a bias power supply part 90 (see FIG. 7) installed outside the chamber body 12. The bias power supply part 90 includes a first power supply 90a and a second power supply 90b. The first power supply 90a is configured to generate a pulse-modulated DC power (a modulated DC voltage). The second power supply 90b is configured to generate a high frequency for biasing. The modulated DC voltage generated from the first power supply 90a and the high frequency generated from the second power supply 90b are selectively supplied to the lower electrode 44.

A flow passage 44f is formed in the lower electrode 44. A refrigerant is supplied to the flow passage 44f. As the refrigerant is supplied to the flow passage 44f, the temperature of the workpiece W is adjusted. The lower electrode 44 is installed on the insulating member 45.

The insulating member 45 is made of an insulator such as quartz or alumina. The insulating member 45 has a substantially disc shape opened at the center. In one embodiment, the insulating member 45 has a first portion 45a and a second portion 45b. The first portion 45a is a central portion of the insulating member 45 and the second portion 45b is a portion that is further spaced apart from the first axis line AX1 than the first portion 45a, i.e., a portion extending outward of the first portion 45a. An upper surface of the first portion 45a extends downward relative to an upper surface of the second portion 45b. A lower surface of the first portion 45a extends downward relative to a lower surface of the second portion 45b. The upper surface of the second portion 45b of the insulating member 45 is brought into contact with the lower surface of the second portion 44b of the lower electrode. Meanwhile, the upper surface of the first portion 45a of the insulating member 45 is spaced apart from the lower surface of the lower electrode 44.

The shaft part 46 has a substantially cylindrical shape and is coupled to the lower surface of the lower electrode 44. Specifically, the shaft part 46 is coupled to the lower surface of the first portion 44a of the lower electrode 44. A central axis line of the shaft part 46 is aligned with the first axis line AX1. When a rotational force is applied to the shaft part 46, the holding part 40 rotates.

The holding part 40 configured by such various components forms a hollow interior space of the mounting table 14 together with the vessel 50. The vessel 50 includes a cover 50a and a body 50b. The cover 50a has a substantially disc shape. A through hole through which the shaft part 46 passes is formed at the center of the cover 50a. The cover 50a extends below the second portion 45b of the insulating member 45, and provides a slight gap between the cover 50a and the second portion 45b. Further, an upper end of the body 50b is coupled to a lower peripheral edge of the cover 50a. The body 50b has a substantially cylindrical shape with a closed lower end.

A magnetic fluid sealing part 52 is installed between the vessel 50 and the shaft part 46. The magnetic fluid sealing part 52 has an inner ring portion 52a and an outer ring portion 52b. The inner ring portion 52a has a substantially cylindrical shape extending coaxially with the shaft part 46, and is fixed to the shaft part 46. Further, an upper end of the inner ring portion 52a is coupled to the lower surface of the first portion 45a of the insulating member 45. This inner ring portion 52a is configured to rotate about the first axis line AX1 together with the shaft part 46.

The outer ring portion 52b has a substantially cylindrical shape and is installed coaxially with the inner ring portion 52a outside the inner ring portion 52a. The upper end of the outer ring portion 52b is coupled to a lower surface of the central portion of the cover 50a. A magnetic fluid 52c is interposed between the inner ring portion 52a and the outer ring portion 52b. Further, a bearing 53 is installed between the inner ring portion 52a and the outer ring portion 52b below the magnetic fluid 52c. The magnetic fluid sealing part 52 provides a sealing structure by which an internal space of the mounting table 14 is separated from the chamber 12c. In addition, the internal space of the mounting table 14 is maintained at atmospheric pressure.

In one embodiment, a member 47 and a member 48 are installed between the magnetic fluid sealing part 52 and the shaft part 46. The member 47 has a substantially cylindrical shape which extends along a portion of an outer peripheral surface of the shaft part 46, i.e., an outer peripheral surface of an upper portion of a third tubular portion 46d and an outer peripheral surface of the first portion 44a of the lower electrode 44, which will be described later. Further, an upper end of the member 47 has an awning shape and extends along the lower surface of the second portion 44b of the lower electrode 44. This member 47 is in contact with the outer peripheral surface of the upper portion of the third tubular portion 46d, the outer peripheral surface of the first portion 44a of the lower electrode 44, and the lower surface of the second portion 44b.

The member 48 has a substantially cylindrical shape which extends along the outer peripheral surface of the shaft part 46, i.e., the outer peripheral surface of the third tubular portion 46d and the outer peripheral surface of the member 47. An upper end of the member 48 has an awning shape and extends along the upper surface of the first portion 45a of the insulating member 45. The member 48 is in contact with the outer peripheral surface of the third tubular portion 46d, the outer peripheral surface of the member 47, the upper surface of the first portion 45a of the insulating member 45, and the inner peripheral surface of the inner ring portion 52a of the magnetic fluid sealing part 52. A sealing member 49a such as an O-ring may be interposed between the member 48 and the upper surface of the first portion 45a of the insulating member 45. In addition, sealing members 49b and 49c such as an O-ring may be interposed between the member 48 and the inner peripheral surface of the inner ring portion 52a of the magnetic fluid sealing part 52. This configuration seals a space defined between the shaft part 46 and the inner ring portion 52a of the magnetic fluid sealing part 52.

A pair of openings is formed along the second axis line AX2 in the body 50b of the vessel 50. Inner end portions of the pair of shaft parts 60a and 60b are inserted into the pair of openings formed in the body 50b, respectively. The pair of shaft parts 60a and 60b has a substantially cylindrical shape. A central axis line of each of the pair of shaft parts 60a and 60b is aligned with the second axis line AX2. The pair of shaft parts 60a and 60b extends outward beyond the chamber body 12. The shaft part 60a is coupled to a rotation driving device outside the chamber body 12. The rotation driving device generates power for rotating the mounting table 14 about the second axis line AX2.

Wirings for various electric systems, a pipe for heat transfer gas, and a pipe for refrigerant pass through an inner hole of the shaft part 60b. These wirings and pipes are connected to the shaft part 46.

The shaft part 46 includes a columnar portion 46a, a first tubular portion 46b, a second tubular portion 46c, and the third tubular portion 46d. The columnar portion 46a has a substantially cylindrical shape and extends along the first axis line AX1. The columnar portion 46a constitutes a wiring for applying a voltage to the electrode film of the electrostatic chuck 42. The columnar portion 46a is connected to a wiring 61 through a slip ring of a rotary connector 54. The wiring 61 extends from the internal space of the mounting table 14 to the outside of the chamber body 12 through the inner hole of the shaft part 60b. The wiring 61 is coupled to a power supply 91 (see FIG. 7) through a switch located outside of the chamber body 12.

The first tubular portion 46b is installed coaxially with the columnar portion 46a and outside the columnar portion 46a. The first tubular portion 46b constitutes a wiring for supplying the modulated DC voltage or the high-frequency bias power to the lower electrode 44. The first tubular portion 46b is connected to the wiring 62 through a separate slip ring of the rotary connector 54. The wiring 62 extends from the internal space of the mounting table 14 to the outside of the chamber body 12 through the inner hole of the shaft part 60b. The wiring 62 is connected to the first power supply 90a and the second power supply 90b of the bias power supply part 90 outside the chamber body 12. Further, the second power supply 90b is connected to the first tubular portion 46b via a matcher for impedance matching installed outside the chamber body 12.

The second tubular portion 46c is installed coaxially with the first tubular portion 46b and outside the first tubular portion 46b. In one embodiment, a bearing 55 is installed inside the rotary connector 54. The bearing 55 extends along the outer peripheral surface of the second tubular portion 46c. The bearing 55 supports the shaft part 46 through the second tubular portion 46c. A gas line for supplying a heat transfer gas is formed in the second tubular portion 46c. This gas line is connected to a pipe 63 via a rotary joint such as a swivel joint. The pipe 63 extends from the internal space of the mounting table 14 to the outside of the chamber body 12 through the inner hole of the shaft part 60b. The pipe 63 is connected to a source 92 (see FIG. 7) of the heat transfer gas outside the chamber body 12.

The third tubular portion 46d is installed coaxially with the second tubular portion 46c and outside the second tubular portion 46c. A supply line for supplying refrigerant to the flow passage 44f and a recovery line for recovering the refrigerant supplied to the flow passage 44f are formed in the third tubular portion 46d. The supply line is connected to a pipe 72 via a rotary joint 70 such as a swivel joint. Further, the recovery line is connected to a pipe 74 via the rotary joint 70. The pipe 72 and the pipe 74 extend from the internal space of the mounting table 14 to the outside of the chamber body 12 through the inner hole of the shaft part 60b. In addition, the pipe 72 and the pipe 74 are connected to a chiller unit 93 (see FIG. 7) outside the chamber body 12.

As illustrated in FIG. 10, a rotary motor 78 is installed in the internal space of the mounting table 14. The rotary motor 78 generates power for rotating the shaft part 46. In one embodiment, the rotary motor 78 is installed at the side of the shaft part 46. The rotary motor 78 is connected to a pulley 80 attached to the shaft part 46 via a conductive belt 82. When a rotational driving force of the rotary motor 78 is applied to the shaft part 46, the holding part 40 rotates about the first axis line AX1. Further, a wiring for supplying electric power to the rotary motor 78 is drawn out to the outside of the chamber body 12 through the inner hole of the shaft part 60b and connected to a motor power supply installed outside the chamber body 12.

As described above, the mounting table 14 is configured to provide the internal space set at atmospheric pressure and accommodate various mechanisms in the internal space. Further, the mounting table 14 is configured to draw out a wiring or a pipe for connecting mechanisms accommodated in the internal space and devices such as the power supply, the gas source, the chiller unit and the like installed outside the chamber body 12 to the outside of the chamber body 12. Further, in addition to the aforementioned wirings and pipes, a wiring for connecting the heater power supply installed outside the chamber body 12 and the heater installed in the electrostatic chuck 42 may be drawn out from the internal space of the mounting table 14 to the outside of the chamber body 12 through the inner hole of the shaft part 60b.

The processing apparatus 10 configured as above can execute step ST1 to step ST4 of the method MT within the single chamber body 12. In the execution of step ST1, the substrate 100 is held by the holding part 40 of the mounting table 14. Further, an angular position of the mounting table 14 in a circumferential direction is set with respect to the second axis line AX2 such that the first axis line AX1 is aligned with the central axis line AXC (see FIG. 7). Accordingly, the central axis line CX of the substrate 100 is arranged on the central axis line AXC so that the substrate 100 faces the first space S1. In addition, the holding part 40 of the mounting table 14 is rotated about the first axis line AX1. Furthermore, an angular position of the shutter 26 in a circumferential direction is set with respect to the central axis line AXC such that the opening 26a of the shutter 26 is positioned between the target 18b and the mounting table 14. Further, a gas is supplied from the gas supply part 13 to the chamber 12c, and an internal pressure of the chamber 12c is depressurized by the exhaust device 15. In addition, a voltage is applied from the power supply 20b to the target holder 16b. This generates plasma of the gas around the target 18b. Ions in the plasma are drawn into the target 18b. When the ions collide with the target 18b, a substance constituting the target 18b is released from the target 18b and deposited on the substrate 100. As a result, the barrier layer 102 is formed on the substrate 100.

In the execution of step ST2 following step ST1, the substrate 100 is held by the holding part 40. That is to say, the workpiece W1 is held by the holding part 40. Further, an angular position of the mounting table 14 in a circumferential direction is set with respect to the second axis line AX2 such that the first axis line AX1 is inclined with respect to the central axis line AXC (see FIG. 8). Accordingly, the workpiece W1 remains facing the second space S2. Further, in the execution of step ST2, the angular position of the mounting table 14 in a circumferential direction is set with respect to the second axis line AX2 such that the first axis line AX1 is inclined with respect to the irradiation direction of ions (in a –X direction in FIG. 8). Accordingly, the center axis line CX of the workpiece W1 is inclined with respect to the irradiation direction of ions. In addition, the holding part 40 of the mounting table 14 is rotated about the first axis line AX1. Further, a gas is supplied from the gas supply part 13 to the chamber 12c, and the internal pressure of the chamber 12c is depressurized by the exhaust device 15. Furthermore, a high frequency is supplied from the high-frequency power supply 32 to the antenna 30. This excites the gas in the second space S2 to generate plasma. Further, a modulated DC voltage or a high frequency for biasing is supplied from the bias power supply part 90 to the lower electrode 44. Accordingly, ions in the plasma are drawn into the workpiece W1. As a result, the barrier layer 102 is etched such that a thickness of the barrier layer 102 formed on the corner portion 100s is locally reduced.

In the execution of step ST3 following step ST2, the substrate 100 is held by the holding part 40. That is to say, the workpiece W2 is held by the holding part 40. Further, an angular position of the mounting table 14 in a circumferential direction is set with respect to the second axis line AX2 such that the first axis line AX1 is aligned with the central axis line AXC (see FIG. 7). Accordingly, the central axis line CX of the workpiece W2 is arranged on the central axis line AXC and the workpiece W2 faces the first space S1. In addition, the holding part 40 of the mounting table 14 is rotated about the first axis line AX1. Furthermore, an angular position of the shutter 26 in a circumferential direction is set with respect to the central axis line AXC such that the opening 26a of the shutter 26 is positioned between the target 18a and the mounting table 14. Further, a gas is supplied from the gas supply part 13 to the chamber 12c, and the internal pressure of the chamber 12c is depressurized by the exhaust device 15. In addition, a voltage is applied from the power supply 20a to the target holder 16a. This generates plasma of the gas around the target 18a. Ions in the plasma are drawn into the target 18a. When the ions collide with the target 18a, a substance (i.e., copper) constituting the target 18a are released from the target 18a and deposited on the workpiece W2. As a result, the seed layer 104 is formed on the workpiece W2 to produce a workpiece W3.

In the execution of step ST4 subsequent to step ST3, the substrate 100 is held by the holding part 40. That is to say, the workpiece W3 is held by the holding part 40. Further, an angular position of the mounting table 14 in a circumferential direction is set with respect to the second axis line AX2 such that the first axis line AX1 is inclined with respect to the central axis line AXC (see FIG. 8). Accordingly, the workpiece W3 remains facing the second space S2. Further, in the execution of step ST4, the angular position of the mounting table 14 in a circumferential direction is set with respect to the second axis line AX2 such that the first axis line AX1 is inclined with respect to the irradiation direction of ions (in a –X direction in FIG. 8). Accordingly, the center axis line CX of the workpiece W3 is inclined with respect to the irradiation direction of ions. In addition, the holding part 40 of the mounting table 14 is rotated about the first axis line AX1. Further, a gas is supplied from the gas supply part 13 to the chamber 12c, and the internal pressure of the chamber 12c is depressurized by the exhaust device 15. Furthermore, a high frequency is supplied from the high-frequency power supply 32 to the antenna 30. This excites the gas in the second space S2 to generate plasma. Further, a modulated DC voltage or a high frequency for biasing is supplied from the bias power supply part 90 to the lower electrode 44. Accordingly, ions in the plasma are drawn into the workpiece W3. As a result, the seed layer 104 is etched such that the thickness of the seed layer 104 formed on the corner portion 100s is locally reduced.

Various embodiments have been described above. The present disclosure is not limited to the aforementioned embodiments but may be differently modified. For example, the method MT may include only one of step ST2 and step ST4.

Further, although a plasma generating part of the aforementioned processing apparatus 10 is the inductively coupled plasma generating part, the processing apparatus 10 may include a capacitively coupled plasma generating part or a plasma generating part using surface waves such as microwaves, instead of the inductively coupled plasma generating part.

According to the present disclosure in some embodiments, it is possible to suppress loss of a base metal layer formed on a wall surface that defines a recess in a substrate and also to expand a width of an opening of the recess reduced by the base metal layer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the present disclosure.

What is claimed is:

1. A method for performing a pre-treatment to form a copper wiring in a recess formed in a substrate, comprising:
   forming a barrier layer on a surface of the substrate that defines the recess; and
   forming a seed layer on the barrier layer,
   wherein the method further comprises:
   at least one of etching the barrier layer and etching the seed layer,
   wherein, in the at least one of etching the barrier layer and etching the seed layer, the substrate is inclined with respect to an irradiation direction of ions at an angle of 10 degrees or more while rotating the substrate.

2. The method of claim 1, wherein the method comprises both the etching the barrier layer and the etching the seed layer, and
   in both the etching the barrier layer and the etching the seed layer, a mounting table configured to hold the substrate inside a single chamber body is inclined such that a central axis line of a holding part of the mounting table is inclined with respect to the irradiation direction of ions, and the holding part is rotated about the central axis line.

3. A processing apparatus, comprising:
   a mounting table including a holding part configured to hold a substrate and to rotate about a first axis line as a central axis line of the holding part, the mounting table being configured to rotate about a second axis line perpendicular to the first axis line;
   a chamber body configured to provide a chamber which accommodates the mounting table therein, the chamber including a first space for film formation and a second space for etching which are arranged in a circumferential direction with respect to the second axis line; and
   a partition wall located between the first space and the second space.

4. The apparatus of claim 3, further comprising:
   a target holder configured to hold a target for film formation disposed in the first space; and
   a plasma generating part configured to excite a gas supplied to the second space.

* * * * *